United States Patent
Mkhitarian et al.

(10) Patent No.: US 10,134,658 B2
(45) Date of Patent: Nov. 20, 2018

(54) HIGH POWER TRANSISTORS

(71) Applicant: MACOM Technology Solutions Holdings, Inc., Lowell, MA (US)

(72) Inventors: Aram Mkhitarian, Glendale, CA (US); Vincent Ngo, Westminster, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/233,556

(22) Filed: Aug. 10, 2016

(65) Prior Publication Data

US 2018/0047656 A1 Feb. 15, 2018

(51) Int. Cl.
| | |
|---|---|
| *H01L 23/482* | (2006.01) |
| *H01L 29/20* | (2006.01) |
| *H01L 29/205* | (2006.01) |
| *H01L 29/778* | (2006.01) |
| *H01L 29/417* | (2006.01) |

(Continued)

(52) U.S. Cl.
CPC ...... *H01L 23/4824* (2013.01); *H01L 23/3114* (2013.01); *H01L 23/49811* (2013.01); *H01L 23/49844* (2013.01); *H01L 29/2003* (2013.01); *H01L 29/205* (2013.01); *H01L 29/41758* (2013.01); *H01L 29/7787* (2013.01)

(58) Field of Classification Search
CPC ............... H01L 23/4824; H01L 23/528; H01L 23/3114; H01L 23/49811; H01L 23/49844; H01L 23/5222; H01L 23/5228; H01L 21/8252; H01L 29/7835; H01L 29/2003; H01L 29/205; H01L 29/41758; H01L 27/088; H01L 29/0692; H01L 29/0696; H01L 29/778–29/7789; H01L 23/5286; H01L 2224/49175; H03F 3/601
USPC .......................................................... 257/76
See application file for complete search history.

(56) References Cited

U.S. PATENT DOCUMENTS

| | | | |
|---|---|---|---|
| 5,519,252 | A | 5/1996 | Soyano et al. |
| 5,703,399 | A | 12/1997 | Majumdar et al. |

(Continued)

FOREIGN PATENT DOCUMENTS

| | | |
|---|---|---|
| CN | 104347579 A | 2/2015 |
| CN | 204836090 U | 12/2015 |

(Continued)

OTHER PUBLICATIONS

International Search Report and Written Opinion for Application No. PCT/US2016/049813 dated Feb. 15, 2017.

(Continued)

*Primary Examiner* — Eric Ward
*Assistant Examiner* — Eric Ashbahian
(74) *Attorney, Agent, or Firm* — Wolf, Greenfield & Sacks, P.C.

(57) ABSTRACT

High power transistors, such as high power gallium nitride (GaN) transistors, are described. These high power transistors have larger total gate widths than conventional high power transistors by arranging multiple linear arrays of gate, drain, and source contacts in parallel. Thereby, the total gate width and the power rating of the high power transistor may be increased without elongating the die of the high power transistor. Accordingly, the die of the high power transistor may be mounted in a smaller circuit package relative to conventional dies with the same power rating.

18 Claims, 7 Drawing Sheets

(51) Int. Cl.
*H01L 23/498* (2006.01)
*H01L 23/31* (2006.01)

(56) References Cited

U.S. PATENT DOCUMENTS

| | | | |
|---|---|---|---|
| 5,796,165 | A | 8/1998 | Yoshikawa et al. |
| 5,982,000 | A * | 11/1999 | Leighton ............. H01L 23/4824 257/341 |
| 6,291,880 | B1 | 9/2001 | Ogawa et al. |
| 6,346,728 | B1 * | 2/2002 | Inoue .................. H01L 23/4824 257/341 |
| 7,061,080 | B2 | 6/2006 | Jeun et al. |
| 9,252,067 | B1 | 2/2016 | Kumar |
| 9,960,127 | B2 | 5/2018 | Gittemeier |
| 2003/0102494 | A1 * | 6/2003 | Akamine ............. H01L 23/4824 257/202 |
| 2006/0138654 | A1 | 6/2006 | Yoshida |
| 2006/0205161 | A1 | 9/2006 | Johan et al. |
| 2008/0157222 | A1 * | 7/2008 | Wang .................. H01L 27/0207 257/401 |
| 2011/0100681 | A1 | 5/2011 | Kimmich et al. |
| 2012/0032190 | A1 | 2/2012 | Takagi |
| 2012/0091986 | A1 * | 4/2012 | Takemae ............. H01L 21/8252 323/311 |
| 2013/0175628 | A1 * | 7/2013 | McIntyre ................ H01L 23/60 257/355 |
| 2014/0191809 | A1 * | 7/2014 | Kamiyama ............ H01L 23/66 330/302 |
| 2015/0035080 | A1 | 2/2015 | Akira et al. |
| 2015/0263002 | A1 * | 9/2015 | Matsumoto ........... H01L 27/088 257/76 |
| 2015/0311332 | A1 * | 10/2015 | Zhang ..................... H01L 24/06 257/76 |
| 2016/0056150 | A1 * | 2/2016 | Nagai ................ H03K 17/0822 257/76 |
| 2016/0233211 | A1 * | 8/2016 | Miura ................. H01L 29/2003 |
| 2017/0338194 | A1 | 11/2017 | Gittemeier |

FOREIGN PATENT DOCUMENTS

| | | |
|---|---|---|
| EP | 0563873 A2 | 10/1993 |
| EP | 1085594 A2 | 3/2001 |
| GB | 1599852 A | 10/1981 |
| JP | H10242377 A | 9/1998 |
| JP | H11150228 A | 6/1999 |
| JP | 2004 288948 A | 10/2004 |
| WO | WO 03/037048 A1 | 5/2003 |
| WO | WO 2015/028839 A1 | 3/2015 |

OTHER PUBLICATIONS

International Search Report and Written Opinion for Application No. PCT/US2017/024279 dated Jul. 12, 2017.
Written Opinion for Application No. PCT/US2016/049813 dated Apr. 6, 2018.

* cited by examiner

HIGH POWER TRANSISTORS

BACKGROUND

Technical Field

The technology relates to high power transistors including, for example, high power gallium nitride (GaN) transistors.

Discussion of the Related Art

GaN semiconductor material has received appreciable attention in recent years because of its desirable electronic and electro-optical properties. For example, GaN has a wide, direct bandgap of about 3.4 eV. Because of its wide bandgap, GaN is more resistant to avalanche breakdown and can maintain electrical performance at higher temperatures than other semiconductors, such as silicon. GaN also has a higher carrier saturation velocity compared to silicon. Additionally, GaN has a Wurtzite crystal structure, is a very stable and hard material, has a high thermal conductivity, and has a much higher melting point than other semiconductors such as silicon, germanium, and gallium arsenide. Accordingly, GaN is useful for high speed, high voltage, and high power applications. For example, gallium nitride materials are useful in semiconductor amplifiers for radio-frequency (RF) communications, radar, RF energy, and microwave applications.

SUMMARY

According to at least one aspect, a power transistor is provided. The power transistor includes a substrate, a first plurality of contacts formed above the substrate and arranged in a first linear array to form a first plurality of transistors, and a second plurality of contacts formed above the substrate and arranged in a second linear array that is in parallel with the first linear array to form a second plurality of transistors.

In some embodiments, the power transistor further includes a third plurality of contacts formed above the substrate and arranged in a third linear array that is in parallel to the first and second linear arrays to form a third plurality of transistors. In some embodiments, at least one transistor of the first and second plurality of transistors is a gallium nitride transistor. In some embodiments, each of the first and second plurality of contacts include a drain contact and the power transistor further includes a drain pad formed above the substrate and electrically coupled to each drain contact of the first and second plurality of contacts. In some embodiments, the first plurality of contacts includes a source contact and the power transistor further comprises a via that passes through the substrate and is electrically coupled to the source contact. In some embodiments, each contact of at least one of the first plurality of contacts and the second plurality of contacts has a width that is larger than its length.

In some embodiments, each of the first and second plurality of contacts includes a gate contact and the power transistor further comprises a gate pad formed above the substrate and coupled to each gate contact of the first and second plurality of contacts. In some embodiments, the gate pad is formed between the first plurality of contacts and the second plurality of contacts. In some embodiments, the first and second plurality of contacts share at least one common drain contact. In some embodiments, the at least one common drain contact has a width that is larger than a width of the gate contact of the first plurality of contacts.

According to at least one aspect, a gallium nitride (GaN) power transistor is provided. The GaN transistor includes a substrate, a GaN layer formed above the substrate, a first plurality of contacts formed above the GaN layer and arranged in a first linear array to form a first plurality of transistors, and a second plurality of contacts formed above the GaN layer and arranged in a second linear array that is in parallel with the first linear array to form a second plurality of transistors.

In some embodiments, the substrate includes at least one of silicon, silicon carbide, gallium arsenide, and sapphire. In some embodiments, the GaN power transistor further includes at least one transition layer formed between the substrate and the GaN layer. In some embodiments, the GaN power transistor further includes an aluminum gallium nitride (AlGaN) layer formed between the GaN layer and at least one of the first plurality of contacts and the second plurality of contacts. In some embodiments, the GaN power transistor further includes a gate pad and each of the first and second plurality of contacts includes a gate contact electrically coupled to the gate pad.

In some embodiments, the GaN power transistor further includes a drain pad and each of the first and second plurality of contacts includes a drain contact electrically coupled to the drain pad. In some embodiments, the GaN power transistor further includes a via that passes through the substrate and the first plurality of contacts includes a source contact electrically coupled to the via.

According to at least one aspect, a packaged power transistor is provided. The packaged power transistor includes an enclosure, a power transistor mounted in the enclosure, and a plurality of terminals attached to the enclosure and electrically coupled to the power transistor. The power transistor includes a substrate, a first plurality of contacts formed above the substrate and arranged in a first linear array to form a first plurality of transistors, and a second plurality of contacts formed above the substrate and arranged in a second linear array that is in parallel with the first linear array to form a second plurality of transistors.

In some embodiments, the power transistor further includes a pad electrically coupled to at least one contact of the first and second plurality of contacts and the packaged power transistor further comprises at least one bonding wire configured to electrically couple the pad to at least one terminal of the plurality of terminals. In some embodiments, at least one transistor of the first and second plurality of transistors is a gallium nitride transistor.

In some embodiments, the substrate of the power transistor is mounted to a surface of the enclosure that is electrically coupled to at least one terminal of the plurality of terminals. In some embodiments, the power transistor includes at least on via that passes through the substrate to electrically couple at least one contact of the first and second plurality of contacts to the surface of the enclosure.

The foregoing embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Figure 1A:
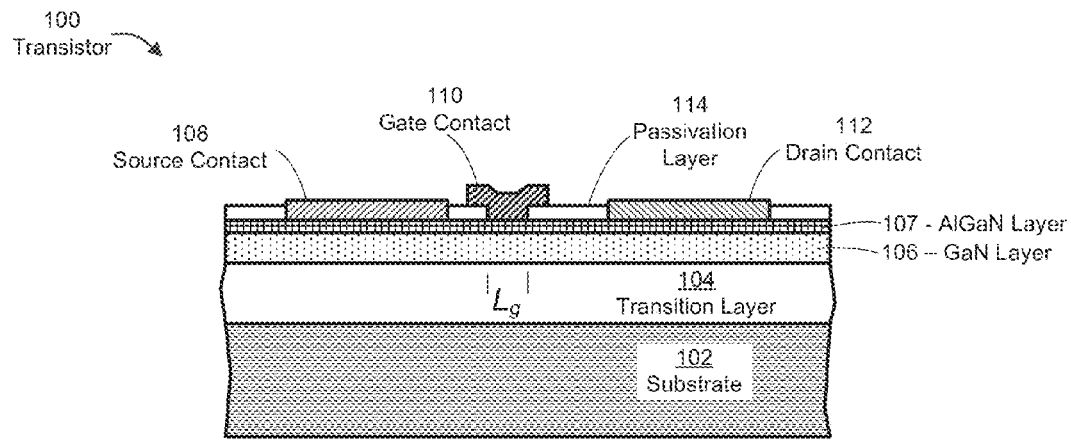
FIG. 1A is an cross-sectional view of an example transistor, according to some embodiments.

Features and advantages of the illustrated embodiments will become more apparent from the detailed description set forth below when taken in conjunction with the drawings.

DETAILED DESCRIPTION

As described above, transistors comprising gallium nitride (GaN) material are useful for high speed, high voltage, and high power applications because of the favorable material properties of GaN. Some applications relating to radio-frequency (RF) communications can place demanding performance requirements on devices that include GaN transistors. For example, some applications may require GaN transistors with a power rating of between approximately 250 Watts and approximately 1000 Watts.

High power transistors may be constructed by, for example, forming a plurality of transistors on a die. Each of these transistors on the die may include gate, source, and drain contacts. The plurality of transistors on the die may be electrically coupled together by electrically coupling like contacts together. For example, the gate contacts may be electrically coupled together. Similarly, the drain contacts may be electrically coupled together and the source contacts may be electrically coupled together.

The power rating of a high power transistor may increase as the total gate width of the high power transistor increases. The total gate width may be equal to the sum of the gate widths of each gate contact in the high power transistor. Thereby, the power rating of a transistor may be increased by adding gate contacts and/or by increasing the width of the gate contacts. Increasing the gate width of individual gate contacts, however, may undesirably decrease the gain of the high power transistor. Conventional transistors arrange a plurality of gate, source, and drain contacts in a single linear array. These conventional transistors achieve higher power ratings by elongating the die and adding additional contacts (including gate contacts) to the single linear array. Thereby, the power rating may be increased without changing the width of the gate contacts or reducing the gain.

The inventors have appreciated that the conventional construction of high power transistors using a single linear array of contacts forms a rectangular die with a length that is substantially longer than its width and only uses a fraction of the space available in a given circuit package. Further, the inventors have appreciated that the heat dissipation through the circuit package may increase as the contact area between the die and the circuit package increases. Accordingly, the inventors have conceived and designed high power transistors that include multiple linear arrays of contacts arranged in parallel to increase the total gate width of a high power transistor without elongating the die. Thereby, a greater portion of the space in a given circuit package may be used and the power rating of the high power transistor may be increased. Further, the increased surface area between the high power transistor and the circuit package allows the additional heat generated by the extra linear array(s) of contacts to be dissipated through the circuit package.

Example Transistors

Figure 1B:
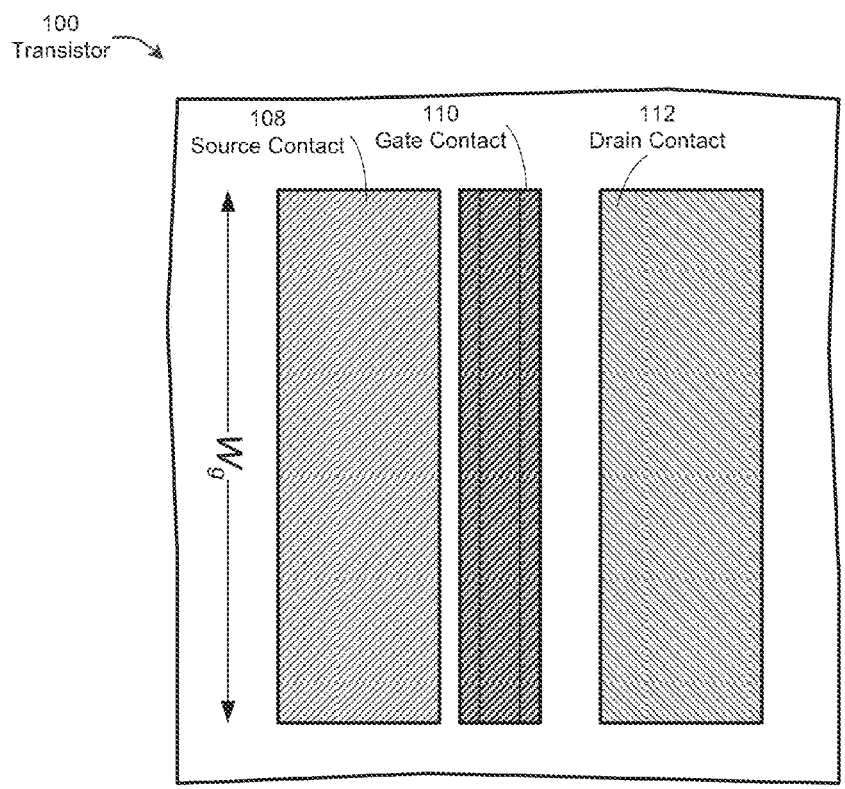
FIG. 1B depicts a top view of the example transistor of FIG. 1A, according to some embodiments.

By way of introductory explanation, a transistor may be formed by a set of contacts above a semiconductor material, such as GaN, on a substrate. An example of such a transistor is shown in FIGS. 1A and 1B by transistor 100. As shown, the transistor 100 includes a substrate 102, a transition layer 104, a GaN layer 106, an aluminum gallium nitride (AlGaN) layer 107, a passivation layer 114, a source contact 108, a gate contact 110, and a drain contact 112. The gate contact 110 may have a width shown as $W_g$ and a length shown as $L_g$.

The substrate 102 may be a semiconductor or an electric insulator that forms the base of the transistor 100. The substrate 102 may comprise, for example, bulk GaN, silicon, silicon carbide, and/or sapphire.

The transistor layer 104 may be formed on the substrate 102 to, for example, facilitate the bonding of the GaN layer 106 to the transistor 100. The transition layer 104 may include a buffer layer (e.g., aluminum nitride) deposited directly on or above the substrate 102.

The GaN layer 106 may include source, channel, and drain regions below the source, gate, and drain contacts 108, 110, and 112, respectively. Carrier transport between the source and drain regions in the GaN layer 106 may be controlled by a voltage applied to the gate contact 110. In some embodiments, the GaN layer 106 may have a low defect density because the GaN layer 114 includes the active region of the device. For example the defect density may be less than approximately $10^8$ cm$^{-2}$.

The GaN layer 106 may include GaN material in any of a variety of forms. For example, the GaN layer 106 may include AlGaN, indium gallium nitride (InGaN), aluminum indium gallium nitride (AlInGaN), gallium arsenide phosphide nitride (GaAsPN), and/or aluminum indium gallium arsenide phosphide nitride (AlInGaAsPN).

The contacts 108, 110, and 112 may be formed above the AlGaN layer 107 to isolate the contacts 108, 110, and 112 from the GaN layer 106. As shown in FIG. 1A, the transistor 100 may include a passivation layer 114 that covers the AlGaN layer 107 while still leaving the contacts 108, 110, and 112 exposed.

It should be appreciated that the transistor 100 may be formed in any of a variety of architectures. For example, the transistor 100 may formed as a depletion-mode, high-electron-mobility transistor (HEMT), a junction field-effect transistor (JFET), a metal-oxide-semiconductor field-effect transistor (MOSFET), a metal-insulator-semiconductor field-effect transistor (MISFET), or a bipolar junction transistor (BJT). Further, the transistor 100 does not need to be a GaN transistor. For example, the transistor 100 may have an active region that comprises silicon and may omit the GaN layer 106 and/or the AlGaN layer 107.

Example Power Transistors

Figure 2A:
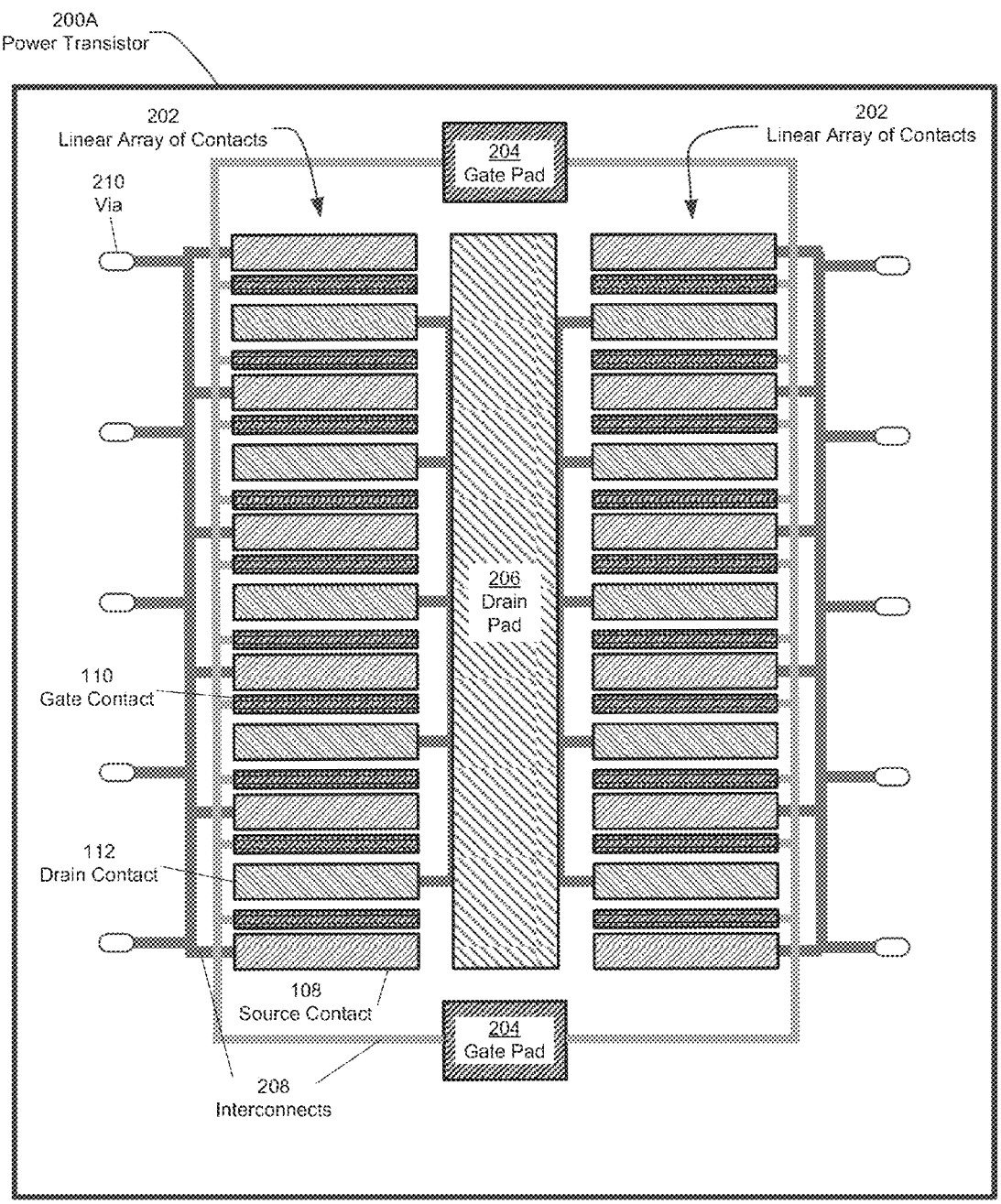
FIG. 2A depicts a plan view of an example power transistor with multiple linear arrays of contacts, according to some embodiments.

A power transistor may be constructed by forming a plurality of transistors, each like transistor 100 shown in FIGS. 1A and 1B, on a die. As discussed above, the plurality of transistors may be arranged in multiple linear arrays to increase the total gate width of a given power transistor while still allowing the power transistor to be mounted within the same circuit package. A plan view of an example of such a power transistor is shown in FIG. 2A by power transistor 200A. As shown, the power transistor 200A includes linear arrays of contacts 202, gate pads 204, drain pads 206, interconnects 208, and vias 210.

The power transistor 200A includes two linear arrays of contacts 202 that are arranged in parallel. Each of the linear arrays of contacts 202 includes source, gate, and drain contacts 108, 110, and 112, respectively, that are arranged to form a plurality of transistors. For example, each linear array of contacts 202 in the power transistor 200A includes ten sets of source, gate, and drain contacts 108, 110, and 112, respectively, that form ten transistors. The gate, drain, and source contacts 108, 110, and 112, respectively, may have a similar (or same) width as shown in FIG. 2A.

It should be appreciated that the particular dimension of each contact and the number of contacts in the power transistor 200A may vary based on the particular implementation. For example, the number of contacts in each linear array of contacts 202 and/or the number of linear arrays of contacts 202 may be adjusted to change the total gate width of the power transistor 200A and, thereby, change the power rating of the power transistor 200A. In addition (or alternatively), the width of each of the gate contacts 110 may be adjusted to change a gain and power rating of the power transistor 200A.

In some embodiments, contacts of the same type in each linear array of contacts 202 and/or in the entire power transistor 200A may be electrically coupled together. For example, the gate contacts 110 may be electrically coupled together by the interconnects 208. Similarly, the drain contacts 112 may be electrically coupled together by the interconnects 208. The source contacts 108 may be electrically coupled together through a conductive surface of a circuit package when the power transistor 200A is packaged. For example, the source contacts 108 may be electrically coupled to vias 210 that pass through a substrate (e.g., through the substrate 102) of the power transistor 200A. In this example, the substrate of the power transistor 200A may be mounted on a conductive surface of the circuit package. Thereby, the source contacts 108 may be electrically coupled to each other through the interconnects 208, the vias 210, and the conductive surface of the circuit package.

The pads 204 and 206 may facilitate the electrical connection between terminals of a circuit package and the contacts within the power transistor 200A. For example, the gate pad 204 may be electrically coupled to the gate contacts 108 through interconnects 208. In turn, the gate pad 204 may be electrically coupled to a gate terminal of a circuit package by a bonding wire. Similarly, the drain pad 206 may be electrically coupled to the drain contacts 112 by interconnects 208 and electrically coupled to a drain terminal of a circuit package by bonding wires. The particular size and location of the pads 204 and 206 may vary based on the particular implementation of the power transistor 200A and/or the circuit package that the power transistor 200A will be mounted in. For example, the drain pad 206 may be larger than the gate pads 204 (e.g., as shown in FIG. 2A) to enable additional bonding wires to connect the drain terminal to the drain pad 206.

In some embodiments, the source contacts 108 of the power transistor 200A may be electrically coupled to a source terminal of a circuit package without a pad or bonding wires. For example, the source contacts 108 may be electrically coupled by interconnects 208 to vias 210 that pass through the substrate of the power transistor 200A. In this example, the substrate of the power transistor 200A may be mounted to a conductive surface of a circuit package that is electrically coupled to the source terminal. Thereby, the vias 210 (in combination with the metal interconnects 208) may electrically the source contacts 108 to the conductive surface and the source terminal.

It should be appreciated that source contacts 108 may be electrically coupled to a source terminal of a circuit package in a similar fashion as the gate and drain contacts 110 and 112, respectively, in some embodiments. For example, the transistor 200A may further include a source pad that is electrically coupled to the source contacts 108 by interconnects 208. The source pads may be employed to provide an additional connection point to the source contacts 108 or used in-place of the vias 210.

As discussed above, the interconnects 208 may electrically couple various elements within the power transistor 200A. The interconnects 208 may be constructed in a variety of ways and may be formed on any of the layers in the power transistor 200A. For example, the interconnects 208 may be metal interconnects patterned over a substrate (e.g., substrate 102) of the power transistor 200A.

Various alterations may be made to the power transistor 200A without departing from the scope of the present disclosure. For example, each of the two large linear arrays of contacts 202 shown in FIG. 2A may each be divided into two smaller linear arrays of contacts that are in line with each other. Dividing up the large linear arrays of contacts may, for example, improve heat dissipation by spreading out the linear arrays of contacts that generate heat. An example of such a power transistor is shown in FIG. 2B by power transistor 200B.

The power transistor 200B divides each of the two linear arrays of contacts 202 shown in FIG. 2A into two smaller linear arrays of contacts 202 that are in-line with each other. Thereby, the power transistor 200B includes four linear arrays of contacts 202. Further, the power transistor 200B divides the single drain pad 206 in FIG. 2A into two smaller drain pads 206 and adds an additional gate pad 204 between the two drain pads 206. Each of the drain pads 206 in power transistor 200B may be electrically coupled to the drain contacts 112 in two of the four linear arrays of contacts 202.

Figure 2B:
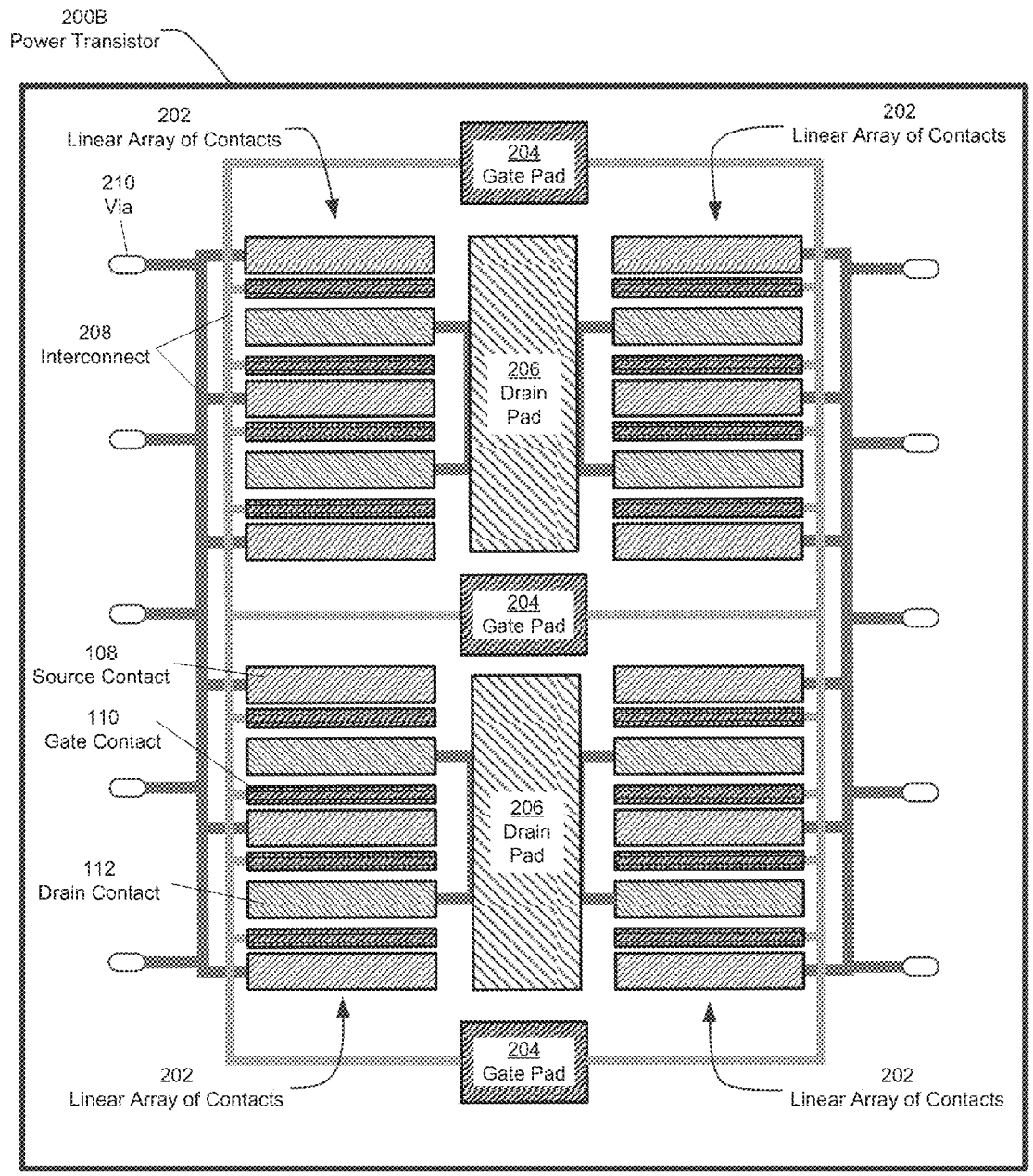
FIG. 2B depicts a plan view of another example power transistor with multiple linear arrays of contacts, according to some embodiments.
Figure 2C:
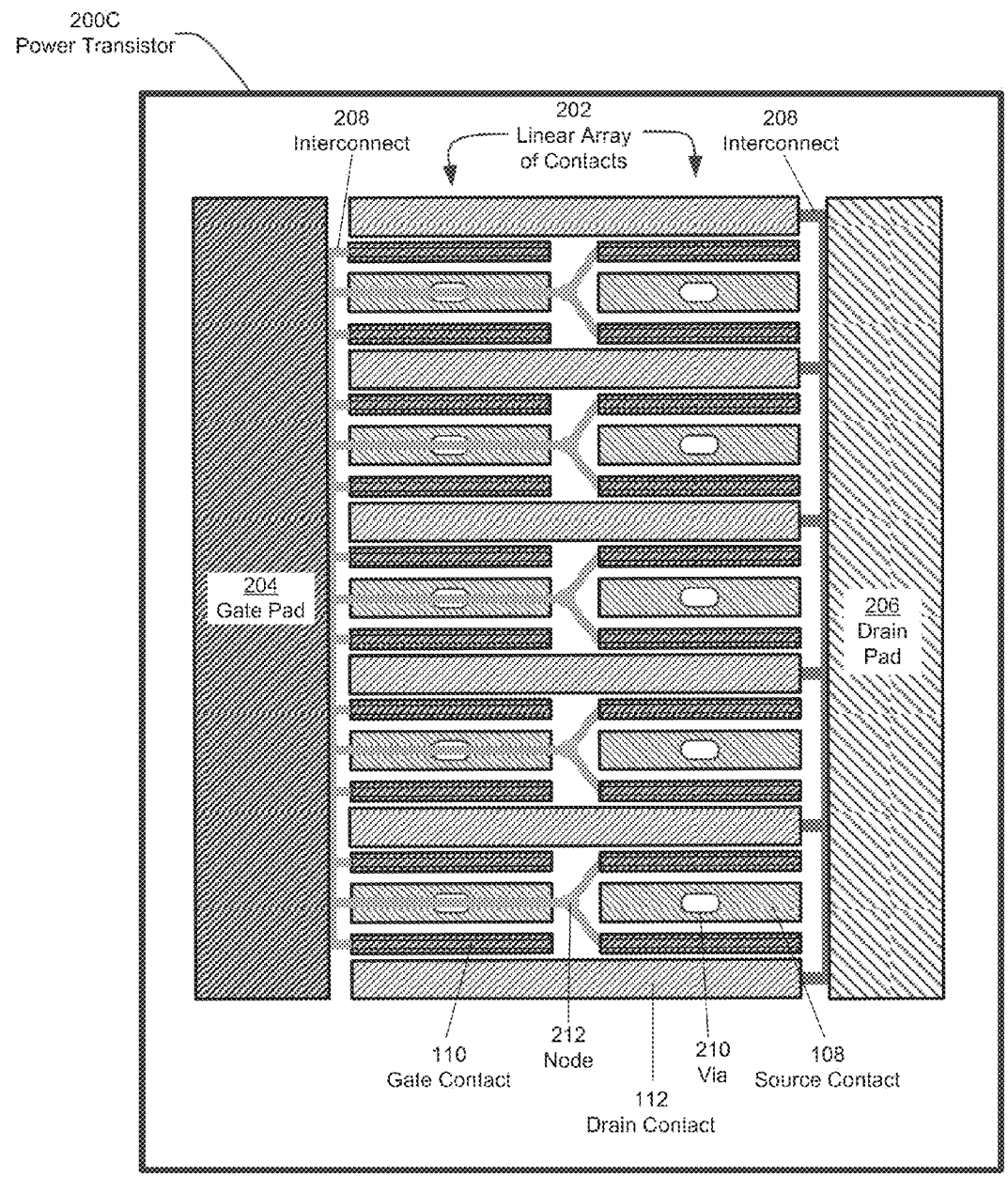
FIG. 2C depicts a plan view of another example power transistor with multiple linear arrays of contacts, according to some embodiments.

As shown in FIGS. 2A and 2B, the pads 204 and/or 206 may be placed between linear arrays of contacts 202. In some embodiments, the pads 204 and 206 may be placed, instead, on opposing sides of the linear arrays of contacts 202 as shown in FIG. 2C by power transistor 200C. As shown, the gate pad 204 is on a first side of the linear arrays of contacts 202 and the drain pad 206 is on a second side of the linear arrays of contacts 202 that is opposite the first side.

As described above, the source contacts 108 may be electrically coupled to a source terminal of a circuit package through vias 210. In FIG. 2C, the vias 210 are placed in the source contacts 108 to electrically couple the source contacts 108 to a conductive surface in the circuit package. Thereby, the interconnects 208 between the source contacts 108 and the vias 210 may be omitted.

In some embodiments, the drain contact 112 may have a different width than the source contacts 108 or the gate contacts 110. For example, the drain contact 112 may have a width that is at least two times larger than the width of the gate contacts 110. As shown in FIG. 2C, employing a longer drain contact 112 may allow a single drain contact 112 to be shared across multiple linear arrays of contacts. Further, the shared drain contact 112 allows the drain pad 206 to be electrically coupled to the drain contact 112 with a direct interconnect 208.

The gate pad 204 in FIG. 2C may be coupled to the gate contacts 110 by interconnects 208 and/or nodes 212. As shown, interconnects 208 may be placed directly between the gate contacts 110 in the linear array of contacts 202 that is proximate the gate pad 204. The interconnects 208 may electrically couple the gate contacts 110 that are in the linear array of contacts 202 that is distal from the gate pad 204 through a node 212. For example, one interconnect 208 may be formed over the source contact 108 (without making an electrical connection to the source contact 108) and electrically couple the node 212 to the gate pad 204. Additional interconnects 208 may electrically couple the node 212 to gate contacts 110 in the linear array of contacts that is distal from the gate pad 204. As shown, the node 212 may be placed between the linear arrays of contacts 202 and be electrically coupled to a pair of gate contacts 110.

Figure 2D:
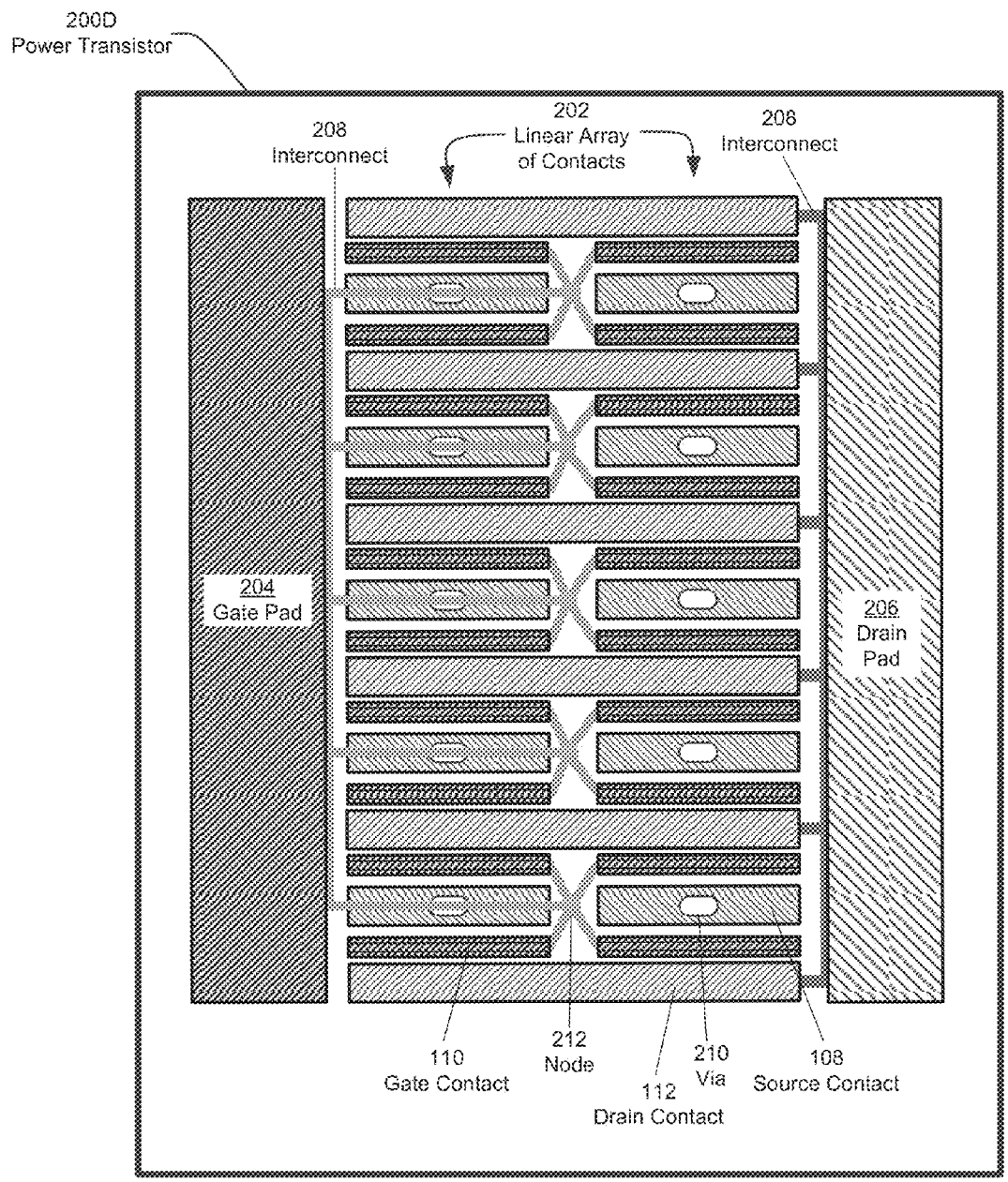
FIG. 2D depicts a plan view of another example power transistor with multiple linear arrays of contacts, according to some embodiments.

It should be appreciated that the interconnects 208 may be arranged in any suitable way to couple the gate pad 204 to the source contacts 108. For example, the interconnects 208 may be routed under or around the source contacts 108 to reach the node 212. Further, the direct interconnects 208 between the gate pad 204 and the gate contacts 110 in the linear array of contacts 202 that is proximate the gate pad 204 may be replaced with interconnects 208 between those gate contacts 110 and the node 212. An example of such a power transistor is shown in FIG. 2D by power transistor 200D. As shown, the gate pads 204 are electrically coupled to all of the gate contacts 110 through the nodes 212. In particular, each node 212 is now electrically coupled to four gate contacts 110 including two gate contacts 110 from each of the two linear arrays of contacts 202.

Figure 3:
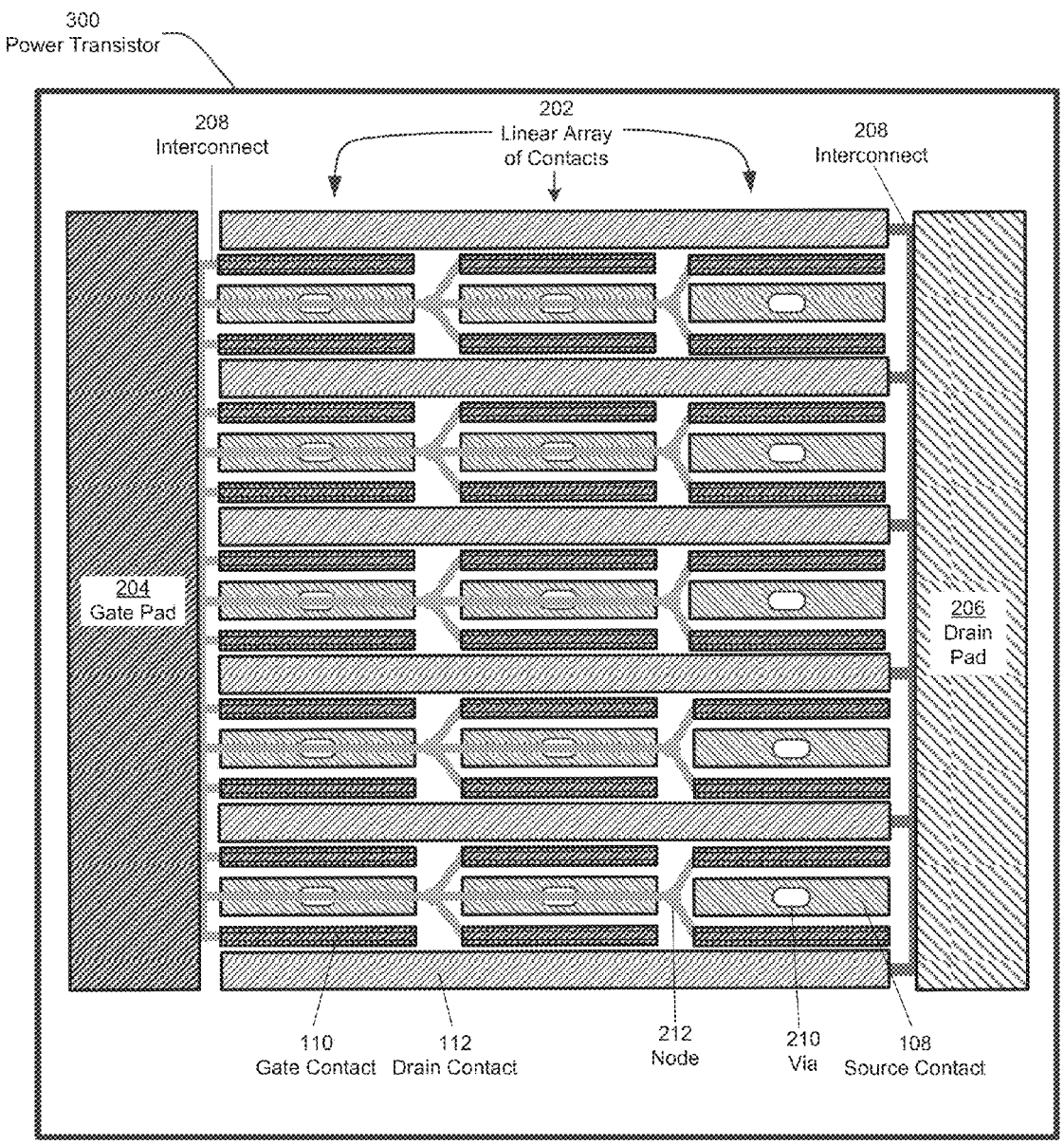
FIG. 3 depicts a plan view of another example power transistor with multiple linear arrays of contacts, according to some embodiments.

In some embodiments, a power transistor may be constructed with more than two linear arrays of contacts in parallel. For example, the power transistor 200C may be extended to include three or more linear arrays of contacts. An example of such a power transistor is shown in FIG. 3 by power transistor 300. As shown, the power transistor 300 includes three linear arrays of contacts 202 arranged in parallel between the gate pad 204 and the drain pad 206. The gate pad 204 may be electrically coupled to the gate contacts 110 in the first linear array of contacts 202 that is proximate the gate pad 204 by direct interconnects 208. The gate contacts 110 in the second linear array of contacts 202 in the middle of the three linear arrays of contacts 202 may be electrically coupled by interconnects 208 to a first node 212 that is between the first and second linear arrays of contacts 202. The first node 212 may be, in turn, electrically coupled to the gate pad 204 by interconnects 208. The gate contacts 110 in the third linear array of contacts 202 that is distal from the gate pad 204 may be electrically coupled by interconnects 208 to a second node 212 that is between the second and third linear arrays of contacts 202. The second node 212 may be, in turn, electrically coupled to the first node 212 and the gate pad 204 by interconnects 208.

Having described various possible implementations of a power transistor with multiple linear arrays of contacts, it should be appreciated that still yet more implementations may be constructed. For example, the power transistor may include additional pads, different pad locations, different arrangements of interconnects, and/or additional linear arrays of contacts.

Example Packaged Power Transistors

Figure 4A:
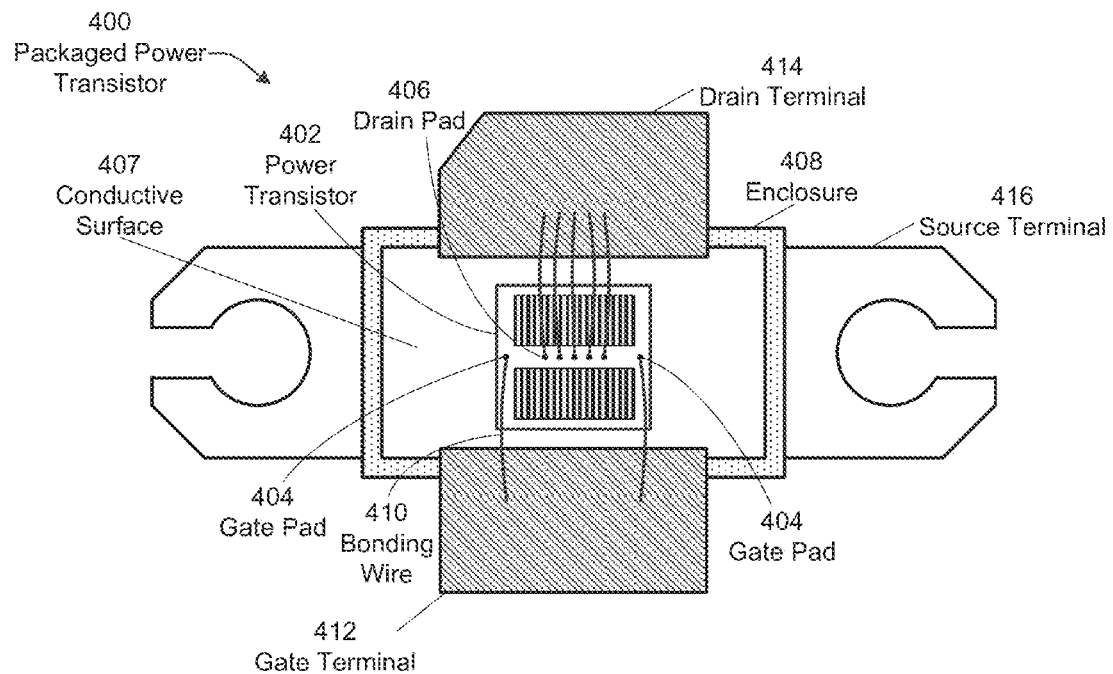
FIG. 4A depicts a bottom view of an example packaged power transistor, according to some embodiments.
Figure 4B:
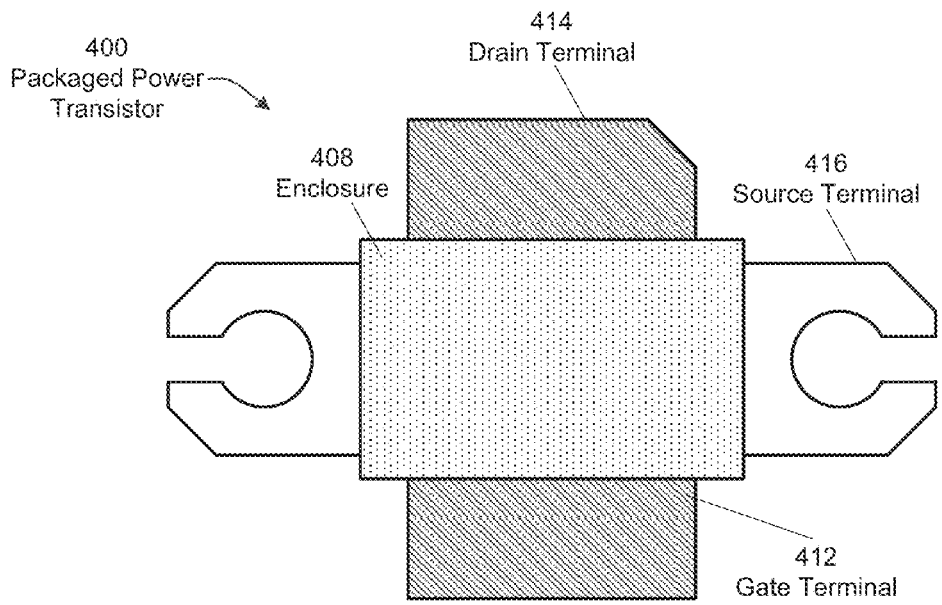
FIG. 4B depicts a top view of the example packaged power transistor shown in FIG. 4A, according to some embodiments.

The power transistors described above with reference to FIGS. 2A-3 may be mounted in a circuit package to, for example, protect the power transistor from the environment and/or dissipate heat from the power transistor during operation. An example of such a packaged power transistor is shown in FIGS. 4A and 4B by packaged power transistor 400. FIG. 4A shows the underside of the packaged power transistor 400 and FIG. 4B shows the topside of the packaged power transistor 400. As shown, the packaged power transistor 400 includes a power transistor 402 mounted to a conductive surface 407 in an enclosure 408. The packaged power transistor further includes a gate terminal 412, a drain terminal 414, and a source terminal 416 that may be attached to the enclosure 408. The power transistor 402 may include gate pads 404 coupled to the gate terminal 412 by bonding wires 410 in addition to drain pads 406 coupled to the drain terminal 414 by bonding wires 410.

The power transistor 402 may include a plurality of transistors arranged in multiple linear arrays, such as power transistors 200A, 200B, 200C, 200D, and 300 described above. The gate contacts of these transistors may be electrically coupled to the gate pad 404. Similarly, the drain contacts of these transistors may be electrically coupled to the drain pad 406. The source contacts of these transistors may be electrically coupled to the conductive surface 407 through vias, such as vias 210 shown in FIGS. 2A-3. It should be appreciated that the particular location, number, and type of pads on the power transistor 402 may vary based on the particular implementation. For example, the power transistor 402 may include a source pad and/or include a different number of drain pads.

The power transistor 402 may be electrically coupled to the gate, drain, and source terminals 412, 414, and 416, respectively. For example, the gate pads 404 on the power transistor 402 may be electrically coupled the gate terminal 412 by bonding wires 410. Similarly, the drain pads 408 may be electrically coupled to the drain terminal 414 by bonding wires 410. As discussed above, the source contacts in the power transistor 402 may be electrically coupled to the conductive surface 407 through vias in the power transistor 402. The conductive surface 407 may be, in turn, electrically coupled to the source terminal 416. For example, the conductive surface 407 may be integral with the source terminal 416. Thereby, the source contacts may be electrically coupled to the source terminal 416 without the use of bonding wires and/or a source pad.

It should be appreciated that additional components may be placed in the enclosure 408 and/or be included in the packaged power transistor 400 that are not shown. For example, the packaged power transistor may further include a matching network with various capacitive elements to improve the performance of the packaged power transistor 400 in a device, such as an RF amplifier.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

When using the terms "on," "adjacent," or "over" in to describe the locations of layers or structures, there may or may not be one or more layers of material between the described layer and an underlying layer that the layer is described as being on, adjacent to, or over. When a layer is described as being "directly" or "immediately" on, adjacent to, or over another layer, no intervening layer is present. When a layer is described as being "on" or "over" another layer or substrate, it may cover the entire layer or substrate, or a portion of the layer or substrate. The terms "on" and "over" are used for ease of explanation relative to the illustrations, and are not intended as absolute directional references. A device may be manufactured and implemented in other orientations than shown in the drawing (for example, rotated about a horizontal axis by more than 90 degrees).

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power transistor comprising:
a substrate;
a first plurality of contacts formed above the substrate and arranged in a first linear array to form a first plurality of transistors that has a first side comprising at least two contacts of the first plurality of contacts and a second side opposite the first side;
a second plurality of contacts formed above the substrate and arranged in a second linear array to form a second plurality of transistors that has a first side comprising at least two contacts of the second plurality of contacts and a second side opposite the first side, the first side of the second linear array facing the second side of the first linear array; and
a third plurality of contacts formed above the substrate and arranged in a third linear array to form a third plurality of transistors that has a first side comprising at least two contacts of the third plurality of contacts and a second side opposite the first side, the first side of the third linear array facing the second side of the second linear array,
wherein each of the first, second, and third plurality of contacts comprises a plurality of gate contacts and wherein the first, second, and third plurality of contacts share a plurality of common drain contacts that have a larger width than a width of the gate contacts in the plurality of gate contacts.

2. The power transistor of claim 1, wherein at least one transistor of the first, second, and third plurality of transistors is a gallium nitride transistor.

3. The power transistor of claim 1, further comprising a drain pad formed above the substrate and electrically coupled to the plurality of common drain contacts.

4. The power transistor of claim 1, wherein the power transistor further comprises a gate pad formed above the substrate and coupled to each gate contact of the first, second, and third plurality of contacts.

5. The power transistor of claim 4, wherein the gate pad is formed adjacent the first plurality of contacts and a drain pad is formed adjacent the third plurality of contacts.

6. The power transistor of claim 1, wherein the first plurality of contacts includes a source contact and wherein the power transistor further comprises a via that passes through the substrate and is electrically coupled to the source contact.

7. The power transistor of claim 1, wherein the width of the plurality of common drain contacts is at least two times larger than the width of the gate contacts in the plurality of gate contacts.

8. A gallium nitride (GaN) power transistor comprising:
a substrate;
a GaN layer formed above the substrate;
a first plurality of contacts comprising a first gate contact having a first width, the first plurality of contacts being formed above the GaN layer and arranged in a first linear array to form a first plurality of transistors that has a first side comprising at least two contacts of the first plurality of contacts and a second side opposite the first side; and
a second plurality of contacts comprising a second gate contact having a second width that is approximately equal to the first width, the second plurality of contacts being formed above the GaN layer and arranged in a second linear array to form a second plurality of transistors that has a first side comprising at least two contacts of the second plurality of contacts and a second side opposite the first side, the first side of the second linear array facing the second side of the first linear array;
wherein the first and second plurality of contacts share a plurality of common drain contacts and wherein the plurality of drain contacts have a third width that is larger than the first width and the second width.

9. The GaN power transistor of claim 8, wherein the substrate includes at least one of silicon, silicon carbide, gallium arsenide, and sapphire.

10. The GaN power transistor of claim 8, further comprising at least one transition layer formed between the substrate and the GaN layer.

11. The GaN power transistor of claim 8, further comprising a gate pad and wherein each of the first and second plurality of contacts includes a gate contact electrically coupled to the gate pad.

12. The GaN power transistor of claim 8, further comprising a drain pad electrically coupled to the plurality of common drain contacts.

13. The GaN power transistor of claim 8, further comprising a via that passes through the substrate and wherein the first plurality of contacts includes a source contact electrically coupled to the via.

14. The GaN power transistor of claim 8, further comprising an aluminum gallium nitride layer formed above the GaN layer.

15. A packaged gallium nitride (GaN) power transistor comprising:
   an enclosure;
   a GaN power transistor mounted in the enclosure, the GaN power transistor including a substrate, a GaN layer formed above the substrate, a first plurality of contacts comprising a first gate contact having a first width, the first plurality of contacts being formed above the substrate and arranged in a first linear array to form a first plurality of transistors that has a first side comprising at least two contacts of the first plurality of contacts and a second side opposite the first side, and a second plurality of contacts comprising a second gate contact having a second width that is approximately equal to the first width, the second plurality of contacts being formed above the substrate and arranged in a second linear array that has a first side comprising at least two contacts of the first plurality of contacts and a second side opposite the first side to form a second plurality of transistors, the first side of the second linear array facing the second side of the first linear array; and
   a plurality of terminals attached to the enclosure and electrically coupled to the GaN power transistor;
   wherein the first and second plurality of contacts share a plurality of common drain contacts and wherein the plurality of drain contacts have a third width that is larger than the first width and the second width.

16. The packaged GaN power transistor of claim 15, wherein the GaN power transistor further includes a pad electrically coupled to at least one contact of the first and second plurality of contacts and wherein the packaged power transistor further comprises at least one bonding wire configured to electrically couple the pad to at least one terminal of the plurality of terminals.

17. The packaged GaN power transistor of claim 15, wherein the substrate of the GaN power transistor is mounted to a surface of the enclosure that is electrically coupled to at least one terminal of the plurality of terminals.

18. The packaged GaN power transistor of claim 17, wherein the GaN power transistor includes at least one via that passes through the substrate to electrically couple at least one contact of the first and second plurality of contacts to the surface of the enclosure.

* * * * *